(12) United States Patent
Hsieh

(10) Patent No.: US 6,593,187 B1
(45) Date of Patent: Jul. 15, 2003

(54) METHOD TO FABRICATE A SQUARE POLY SPACER IN FLASH

(75) Inventor: Chia-Ta Hsieh, Tainan (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/940,160

(22) Filed: Aug. 27, 2001

(51) Int. Cl.[7] ............................................. H01L 21/336
(52) U.S. Cl. ................... 438/257; 438/258; 438/259; 438/238; 438/239; 438/243; 438/244; 438/386; 438/387; 257/296; 257/300; 257/301
(58) Field of Search ................... 438/257–59, 238–39, 438/243–44, 386–87, 393–96, 618–640; 257/296–316, 774

(56) References Cited

U.S. PATENT DOCUMENTS

| | | | |
|---|---|---|---|
| 5,998,263 A | * 12/1999 | Sekariapuram et al. | 438/259 |
| 6,051,860 A | 4/2000 | Odanaka et al. | 257/316 |
| 6,091,102 A | * 7/2000 | Sekariapuram et al. | 257/316 |
| 6,133,098 A | 10/2000 | Ogura et al. | 438/267 |
| 6,143,606 A | * 11/2000 | Wang et al. | 438/257 |
| 6,204,126 B1 | 3/2001 | Hsieh et al. | 438/267 |
| 6,228,695 B1 | 5/2001 | Hsieh et al. | 438/201 |
| 6,303,439 B1 | * 10/2001 | Lee et al. | 438/259 |
| 6,309,928 B1 | * 10/2001 | Sung et al. | 438/265 |
| 6,326,660 B1 | * 12/2001 | Lin et al. | 257/314 |
| 6,380,035 B1 | * 4/2002 | Sung et al. | 438/264 |
| 6,399,466 B2 | * 6/2002 | Nakamura | 438/591 |
| 6,441,418 B1 | * 8/2002 | Shields et al. | 257/296 |
| 2001/0000626 A1 | * 5/2001 | Kalnitsky et al. | 257/316 |
| 2001/0041434 A1 | * 11/2001 | Nakamura | 438/591 |
| 2002/0072197 A1 | * 6/2002 | Kang et al. | 438/424 |

* cited by examiner

*Primary Examiner*—Matthew Smith
*Assistant Examiner*—Granvill D Lee, Jr.
(74) *Attorney, Agent, or Firm*—George O. Saile; Stephen B. Ackerman; Stephen G. Stanton

(57) ABSTRACT

A square poly-spacer and making of the same are disclosed. The square poly-spacer is formed adjacent a floating poly-gate sharing a common source line with another floating poly-gate. The common source line comprises polysilicon and is separated from the floating poly-gate by an intervening oxide spacer. The square poly-spacer is also separated from the floating gate by an intergate oxide layer, and serves as a control gate and communicates with a salicided word line formed over the square top of the poly-spacer. It is shown that a square poly-spacer can be formed advantageously by first chemical mechanical polishing a poly spacer and then performing an etch back of the polysilicon, rather than just performing an etch back only. The square top, rather than the continuously contoured sloping wall, prevents the bridging that can occur over a curved poly spacer to the substrate when a portion of the poly spacer surface is salicided to obtain a well behaving word line.

49 Claims, 13 Drawing Sheets

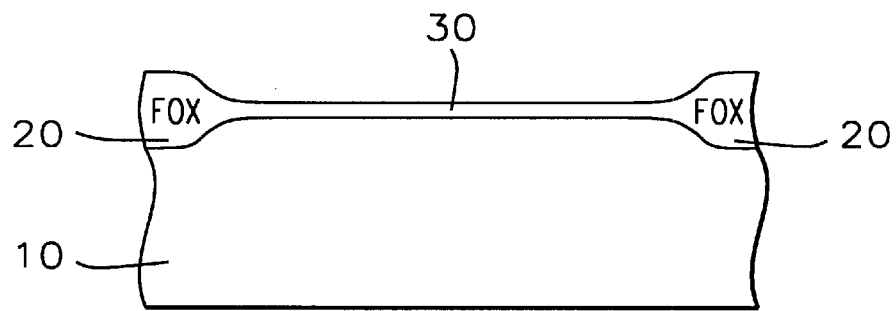
FIG. 1a – Prior Art
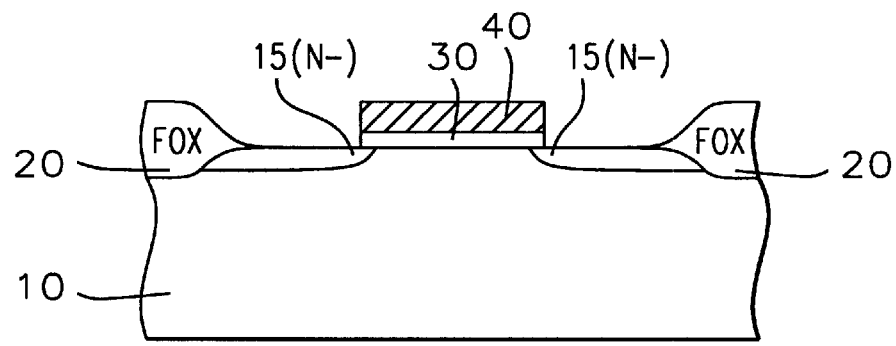
FIG. 1b – Prior Art
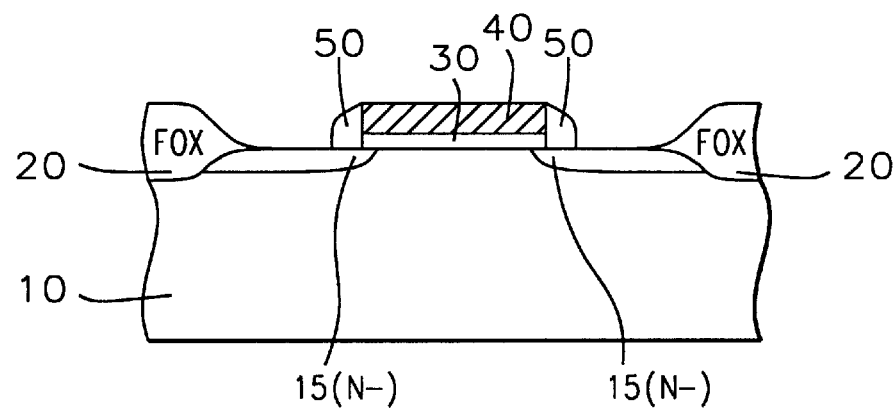
FIG. 1c – Prior Art

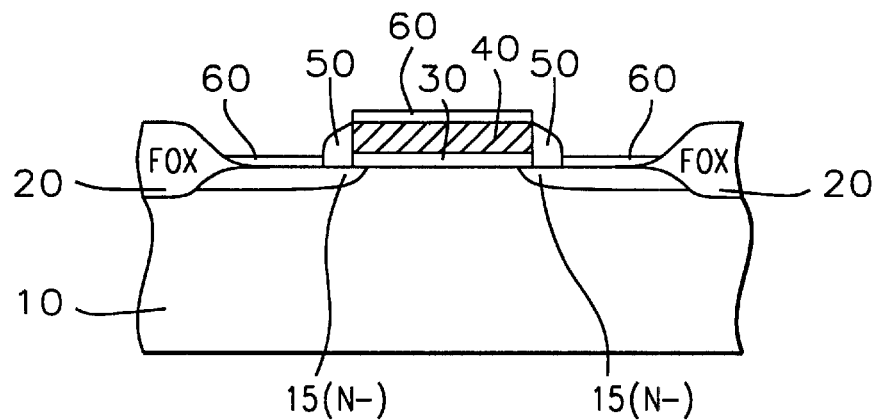
*FIG. 1d – Prior Art*
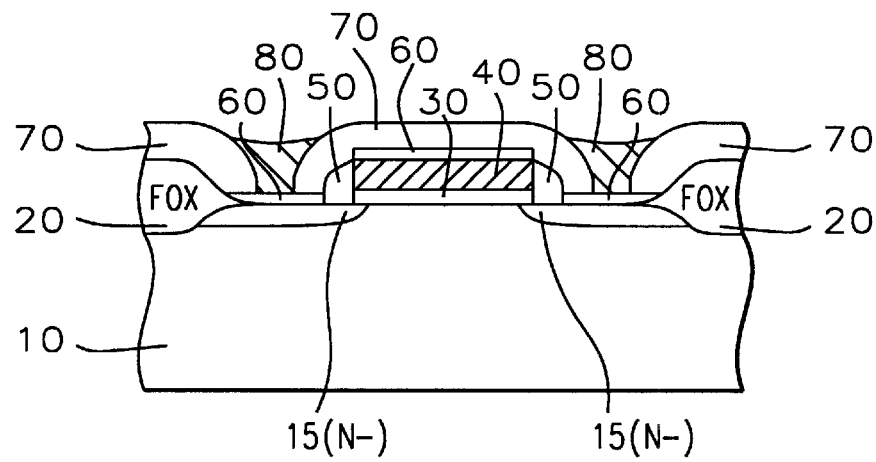
*FIG. 1e – Prior Art*
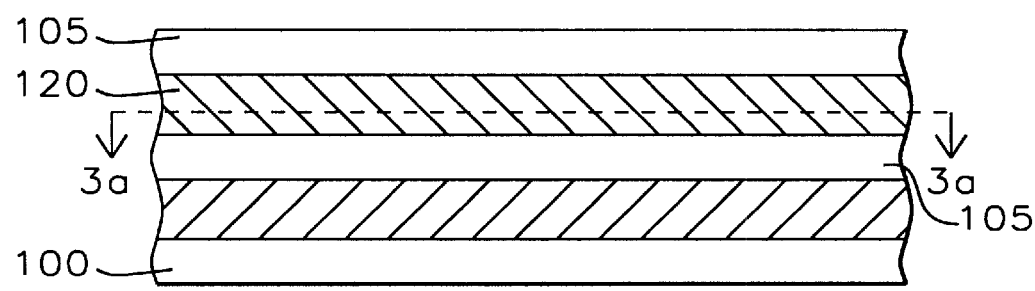
*FIG. 2a*

METHOD TO FABRICATE A SQUARE POLY SPACER IN FLASH

BACKGROUND OF THE INVENTION (1) Field of the Invention

The present invention relates to the manufacture of semiconductor devices, and in particular, to a method of forming a square spacer to alleviate the problem of bridging during the salicide process.

(2) Description of the Related Art

Oxide spacers have been used to advantage in several different ways in the manufacture of semiconductor devices. They are used for structural as well as electrical and programmability reasons. A well-known structural use, shown in FIGS. 1a–1f, is in the manufacture of field effect transistors (FETs), which are also very well-known for their very small size, high packing density in the Ultra Scale Integration (ULSI) technology. Employing conventional methods, gate-oxide layer (30) is first formed over substrate (10) having already defined active regions bounded by passive field oxide regions (20) shown in FIG. 1a. A polysilicon layer is blanket deposited over the substrate and etched to form poly-gate (40), as shown in FIG. 1b. Gate-oxide other than that underlying the poly-gate is also etched away. Using poly-gate as a self-aligned mask, ion implantation is usually employed to form source and drain regions (15). Subsequently, an oxide layer (not shown) is formed over the substrate and anisotropically etched, following conventional methods, to form oxide spacers (50) shown in FIG. 1c.

One of the early structural uses of oxide spacers such as shown (50) in FIG. 1d was in forming self-aligned silicide (SAC) contacts, which are well-known in the art. Thus, after the forming of the spacers, metal used to form the silicide is deposited over the substrate. The substrate is then heated, which causes the silicide reaction to occur wherever the metal is in contact with the silicon. Everywhere else, the metal remains unreacted. The unreacted metal is selectively removed through the use of an etchant that does not attack the silicide, the silicon, or the oxide. As a result, each exposed source and drain region is now completely covered by silicide film (60), but there is no film elsewhere. A dielectric layer, (70), is next deposited onto the silicide, and contact holes are opened in it down to the silicide layer following conventional techniques (FIG. 1e). Metal (80) is deposited into the contact holes to make contact with the silicide, which provides excellent electrical characteristics. Thus, oxide spacers perform the structural function of separating silicided areas from shorting each other.

However, spacers (50) on the sidewall of gates, hence sometimes called sidewall spacers, also provide an important function in aligning ion implants which in turn control electron flow to and fro between the floating gate and the channel in the semiconductor substrate. At the same time, when sidewall spacers are used to decrease cell size in a split gate flash by way of being formed of polysilicon so that they can function as a word line, they will in fact short with the substrate, especially when silicided for better electrical performance, unless they are shaped properly, as disclosed later in the embodiments of the present invention.

In prior art, U.S. Pat. No. 6,228,695 by Hsieh, et al., discloses a split-gate with self-aligned source and self-aligned floating gate formed as a spacer. That is, a poly-1 layer is first formed as a vertical control gate. Then, a poly-2 layer is formed as a spacer floating gate adjacent to the control gate with an intervening intergate oxide layer. The resulting self-aligned source alleviates punch-through from source to control gate while the self-aligned floating gate with respect to the control gate provides improved programmability. In another U.S. Pat. No. 6,204,126, Hsieh, et al., disclose a multi-self-aligned split-gate flash memory cell where the floating gate of the cell is self-aligned to trench isolation, to source and to word line. This multi-self-aligned structure provides the maximum shrinkage of a memory cell that is possible.

A dual-bit multi-level ballistic flash memory cell is shown in another U.S. Pat. No. 6,133,098 by Ogura, et al. Here, two side wall spacer floating gates are paired with a single word line select gate, and word lines are arranged to be perpendicular both the bit lines and control gate lines. Odanaka, et al., on the other hand, in U.S. Pat. No. 6,051,860 take advantage of a step provided by a spacer where a first surface region at a first level is formed, then a second surface region at a second level lower than the first level, and a step side region linking the first surface region and the second surface region together formed so that a channel with a triple structures formed. Thus, a high electric field is formed in a corner portion between the step side region and the second surface region and in the vicinity thereof, thereby improving the efficiency with which the electrons are injected into a floating gate.

In order to enhance the function of spacers, however, and in some cases to prevent, it is important to form spacers of a certain shape as disclosed below.

Prior art shows the use of sidewall spacers for various purposes. It is shown in the present invention that by a judicious choice of a particular shape, the function of spacers can be enhanced further, and in some cases, unwanted shorts between the substrate and the controlling gates can be prevented.

SUMMARY OF THE INVENTION

It is therefore an object of the present invention to provide a method of forming a square spacer in a flash memory cell in order to prevent bridging between a word line and the substrate.

It is another object of the present invention to provide a method of forming a square spacer through using chemical mechanical polishing followed by etch back, instead of just etch back which yields non-square spacer which is susceptible to bridging with salicided word lines.

It is yet another object of the present invention to provide a split gate flash memory cell with a square poly spacer absent of any bridging between the substrate and salicided word line.

These objects are accomplished by providing a substrate having a plurality of active and field regions defined; forming a first oxide layer over said substrate; forming a first polysilicon layer over said first oxide layer; forming a first nitride layer over said first polysilicon layer; defining said first nitride layer to form a shallow trench isolation in said substrate; forming a self-aligned diffusion layer in said substrate; forming a second nitride layer over said substrate; patterning said second nitride layer to define a cell area in said substrate; etching through said patterning in said second nitride layer to form a sloped profile in said first polysilicon layer; forming a second oxide layer over said substrate, including over said sloped profile in said first polysilicon layer; planarizing said second oxide layer over said substrate; patterning said second oxide layer to form an opening including over said cell area; etching through said patterning in said second oxide layer to remove said second nitride layer over said cell area; etching further through said patterning in said second oxide layer to remove underlying said first polysilicon layer to form an opening until said substrate is reached; forming a third oxide layer over said substrate, including over said opening reaching said substrate; etching said third oxide layer to form an oxide spacer along the vertical walls of said opening reaching said substrate; forming a second polysilicon layer over said substrate, including over said oxide spacer in said opening reaching said substrate; planarizing said second polysilicon layer over said substrate; oxidizing said second polysilicon layer in said opening reaching said substrate to form a fourth oxide layer; removing said second nitride layer, thus exposing portions of said first polysilicon layer; removing said portions of said first polysilicon layer, thus exposing portions of said first oxide layer; removing said portions of said first oxide layer; forming a fifth oxide layer over said substrate, including over said fourth oxide layer and second oxide layer; forming a third polysilicon layer over said substrate, including over said fourth oxide layer; planarizing said third polysilicon layer until stopped on said fifth oxide layer over said cell area to form a flat top of said third polysilicon layer; etching back said third polysilicon layer to form a square polysilicon (poly)spacer; forming a third nitride layer over said substrate, including over said square poly-spacer; etching said third nitride layer to form a nitride spacer along the vertical walls, including that of said square poly-spacer; and forming salicide over said substrate, including over the top of said square poly-spacer to form a word line without any bridging between said word line and said substrate.

The objects of the instant invention are further accomplished by providing a split-gate flash memory cell having a square poly-spacer, which serves as a control gate coupled to a wordline. The cell comprises: a substrate; a gate oxide layer over said substrate; two floating gates sharing a source line therebetween said floating gates, wherein said floating gates are separated from said source line with an intervening oxide spacer; two oxide caps formed over said two floating gates; an oxide cap over said source line therebetween said floating gates; an intergate oxide layer encompassing said two floating gates and their said two oxide caps, including said source line with its own oxide cap therebetween; a square poly-spacer vertically adjacent said intergate oxide layer encompassing said two floating gates and source line therebetween; a salicide word line formed over the top of said square poly-spacer; and a nitride spacer formed on the vertical walls of said square poly-spacer and another nitride spacer adjacent said intergate oxide layer on the vertical walls of said floating gates.

BRIEF DESCRIPTION OF THE DRAWINGS

FIG. 1a is a cross-sectional view of a portion of a semiconductor substrate showing the forming of gate oxide layer over an active area defined by field oxide regions, according to prior art.

FIG. 1b is a cross-sectional view of a portion of a semiconductor substrate showing the patterning of a polysilicon gate electrode and the forming of the lightly doped source/drain (S/D) regions of the substrate, according to prior art.

FIG. 1c is a cross-sectional view of a portion of a semiconductor substrate showing the forming of sidewall spacers, according to prior art.

FIG. 1d is a cross-sectional view of a portion of a semiconductor substrate showing the forming of silicided metal, according to prior art.

FIG. 1e is a cross-sectional view of a portion of a semiconductor substrate showing the forming of self-aligned silicide contacts (SAC), according to prior art.

FIGS. 2a and 3a are the top and cross-sectional views, respectively, of a portion of a substrate showing the forming of a gate oxide layer and a first polysilicon layer over the substrate having already defined cell diffusion and shallow trench isolation regions, according to the present invention.

DESCRIPTION OF THE PREFERRED EMBODIMENTS

Figure 2B:
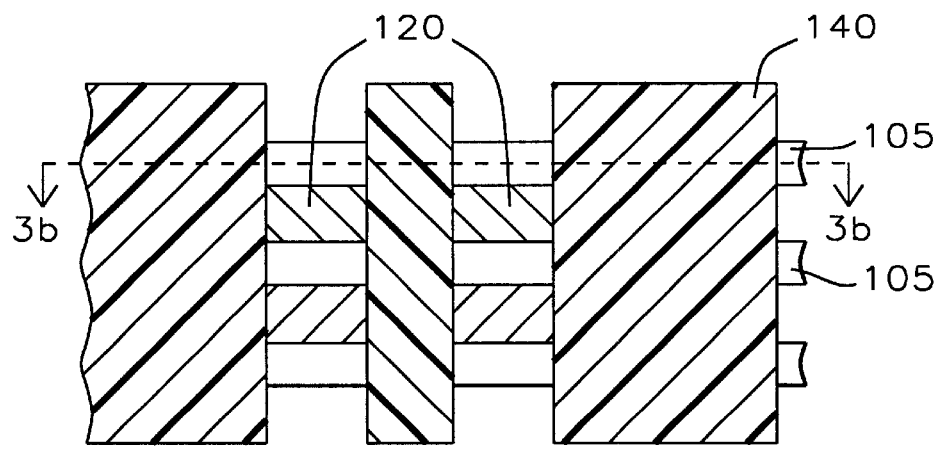
FIGS. 2b and 3b are the top and cross-sectional views, respectively, of a portion of a substrate showing the forming of a gate oxide layer and a first polysilicon layer over the substrate having already defined cell diffusion and shallow trench isolation regions, according to the present invention.

Referring now to the drawings, namely, to FIGS. 2a–2h and 3a-3h first, there is shown new steps of forming a poly spacer in a split-gate flash memory cell in order to improve charge transfer from a semiconductor substrate to a word line. It will be apparent from the drawings that FIGS. 2a–2h are top views of a portion of a substrate while FIGS. 3a–3h are the cross-sectional views taken at corresponding locations shown on the top views.

While FIGS. 2a–2h/3a–3h show the process steps of forming poly-spacers as practiced in the current manufacturing line, FIGS. 4a–4i and 5a–5i show a preferred method where the poly-spacer is made of a square shape. This is because, the square top, rather than the normal continuously sloping wall, prevents the bridging that can occur over a curved poly-spacer to the substrate when a portion of the poly spacer surface is salicided to obtain an electrically well connected word line, as disclosed below. Again, FIGS. 5a–5i are the cross-sectional views taken at the corresponding locations shown in the top views of FIGS. 4a–4i.

In FIG. 2a, top view of a portion of substrate (100) is shown. The substrate is preferably a single-crystal silicon doped with a first conductive type dopant, such as boron (B). The substrate is provided with a plurality of active and passive field regions, as is known in the art. The latter can be shallow trench isolation (STI) regions as referenced by numeral (105) in FIG. 2a. Gate oxide, layer (110), is first formed over the substrate, and then first polysilicon layer (120) as shown in the same Figure. A layer of silicon nitride (about 1600 angstroms thick, but not shown) is also formed over the polysilicon layer, which is then patterned to form trenches for STI. Following known practices, shallow trenches are formed and filled with isolation materials with the resultant top view as seen in FIG. 2a, where the diffusion regions for the memory cells are self-aligned to polysilicon strips (120).

Figure 3A:
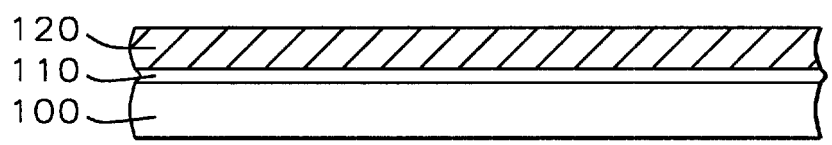

A cross-sectional view of FIG. 2a is shown in FIG. 3a. Gate oxide, or first oxide layer (110) is formed to a thickness between about 70–90 angstroms (Å). The preferred method of forming the gate oxide is by thermal oxidation in dry oxygen carried out in an oxidation furnace in a temperature range between about 800 to 1000° C. Alternatively, other oxidation methods can be used, such as oxidation in a dry oxygen and anhydrous hydrogen chloride in an atmospheric or low pressure environment, or low temperature, high-pressure, and the like. Polysilicon is formed through methods including but not limited to Low Pressure Chemical Vapor Deposition (LPCVD) methods, Chemical Vapor Deposition (CVD) methods and Physical Vapor Deposition (PVD) sputtering methods employing suitable silicon source materials, preferably formed through a LPCVD method employing silane $SiH_4$ as a silicon source material at a temperature range between about 530 to 620° C. The preferred thickness is between about 750 to 850 Å. The polysilicon layer can be doped in situ or by ion implantation with arsenic (As) or phosphorus (P) to a preferred dose between about $1\times10^{15}$ to $1\times10^{16}$ atoms/cm$^2$.

Figure 3B:
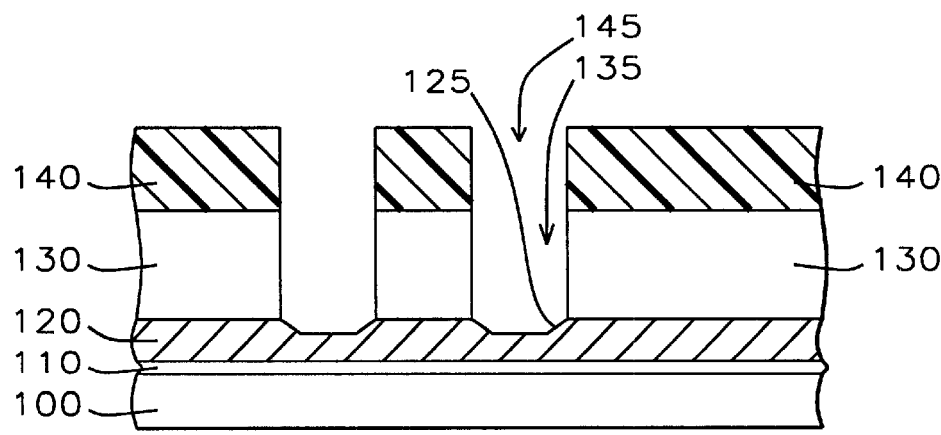

A second nitride layer, preferably silicon nitride layer (130) shown in FIG. 3b, is next formed over first polysilicon layer (120) by reacting dichlorosilane ($SiCl_2H_2$), or silane ($SiH_4$), with ammonia ($NH_3$) in an LPCVD at a temperature between about 700 to 800° C. The preferred thickness of silicon nitride (SiN) is between about 2400 to 2600 Å.

The nitride layer is next patterned to define cell areas. This is accomplished by forming photoresist layer (140) over the nitride layer to a thickness between about 1.0 to 1.2 micrometers ($\mu$m). The photoresist pattern (145) is then etched into the nitride layer to form opening (135) which is better seen in FIG. 3b. The top view is shown in FIG. 2b.

Next, the exposed polysilicon layer at the bottom of opening (135) is etched to assume a sloped profile (125). The slope provides a polysilicon (poly) tip, which enhances the charge transfer between the substrate and the floating gate to be formed. The poly etch is performed to a depth between about 100 to 350 Å. Subsequently, the photoresist is removed, using oxygen plasma ash, for example.

Figure 2C:
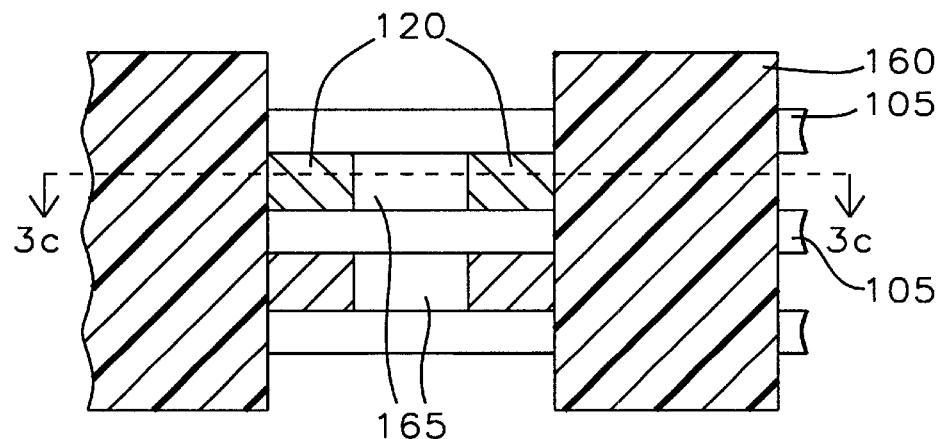
FIGS. 2c and 3c are the top and cross-sectional views, respectively, of a portion of a substrate showing the patterning of a second nitride layer over the first polysilicon layer and the forming of poly tips, according to the present invention.
Figure 2D:
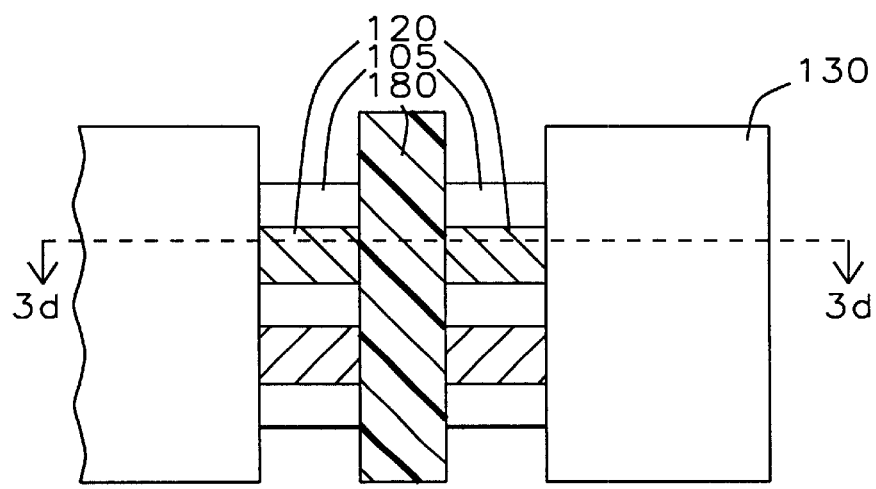
FIGS. 2d and 3d are the top and cross-sectional views, respectively, of a portion of a substrate showing the forming of a second oxide layer and oxide spacers as well as the filling of a source line opening with a second polysilicon layer, and the subsequent chemical mechanical polishing (CMP) of the substrate, according to the present invention.
Figure 3C:
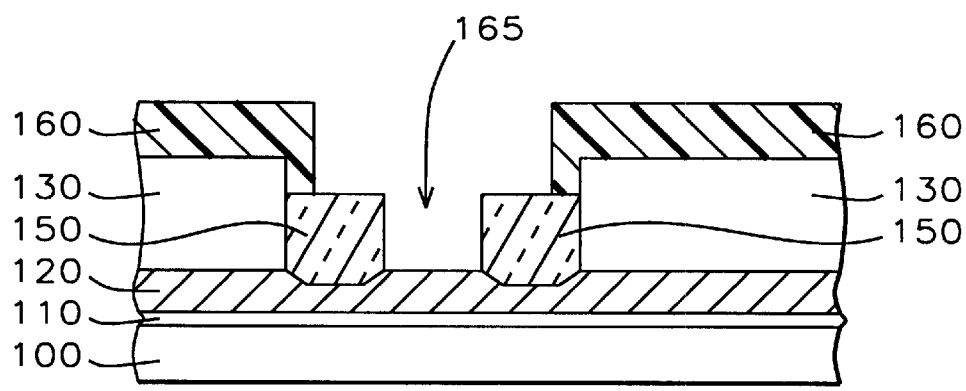

Then, a second oxide layer is deposited over the substrate, including over openings (135), and planarized using chemical mechanical polishing (CMP). This is followed by forming second photoresist layer (160) and patterning it to define a cell source area. FIG. 3c shows the step after having deposited second oxide layer (150), which now fills what was opening (135), and after etching the second nitride layer following the pattern in the photoresist, so that a new opening (165) reaches the underlying gate oxide layer (110) over a cell area in substrate (100). A top view of the substrate at this process step is shown in FIG. 2c.

Second oxide layer is formed by an atmospheric or low pressure chemical vapor deposition (CVD) process, preferably to a thickness between about 2500 to 3500 Å. The second photoresist layer again has a thickness between about 1.0 to 1.2 $\mu$m. The second nitride layer and the underlying polysilicon layer at the bottom of opening (165) are next etched.

Figure 3D:
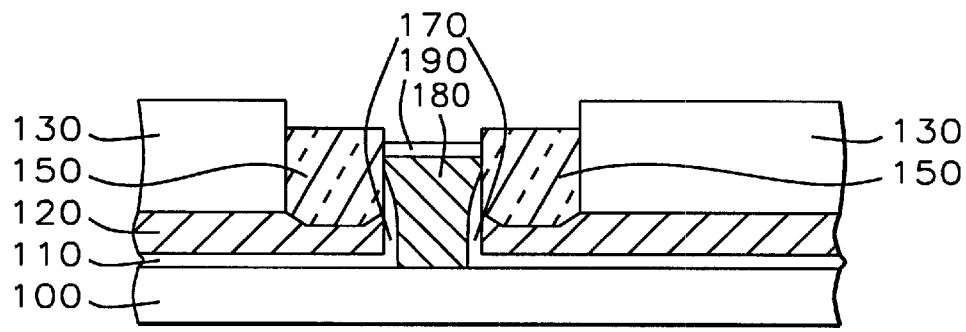

Subsequently, the second photoresist layer is removed, and a third oxide layer is formed over the substrate, including over opening (165). The preferred thickness of the third oxide layer is between about 450 to 550 Å. This third oxide layer is then etched to form oxide spacers (170) along the vertical walls of opening (165) as shown in FIG. 3d. The etching is continued until first gate oxide layer (110) at the bottom of the opening is also removed, and surface of the underlying substrate is reached. Afterwards, a second polysilicon layer is deposited over the substrate, including filling opening (165) over the source area in the substrate as seen in FIG. 3d, and any excess is removed by performing CMP on the substrate. The preferred thickness of second polysilicon layer (180) is between about 2500 to 3500 Å. The resulting structure is shown in FIG. 3d with the top view shown in FIG. 2d.

After the second CMP, the second polysilicon layer is next oxidized in a wet environment at a temperature between about 800 to 1000° C. to form a fourth oxide layer, or poly oxide cap (190) shown in FIG. 3d. The thickness of poly cap layer (190) is between about 150 to 250 Å. Then, second nitride layer (130) is removed in a high-density plasma (HDP) nitride etcher with carbon fluoride-oxygen ($CF_4$—$O_2$) containing plasmas. This is followed by thermally growing a fifth oxide layer over the substrate at a temperature between about 800 to 1000° C. This fifth oxide layer (200) shown in FIG. 3e preferably has a thickness between about 165 to 175 Å, and will serve as an intergate oxide between floating gate (150) and the control gate to be formed at the next step.

Figure 2E:
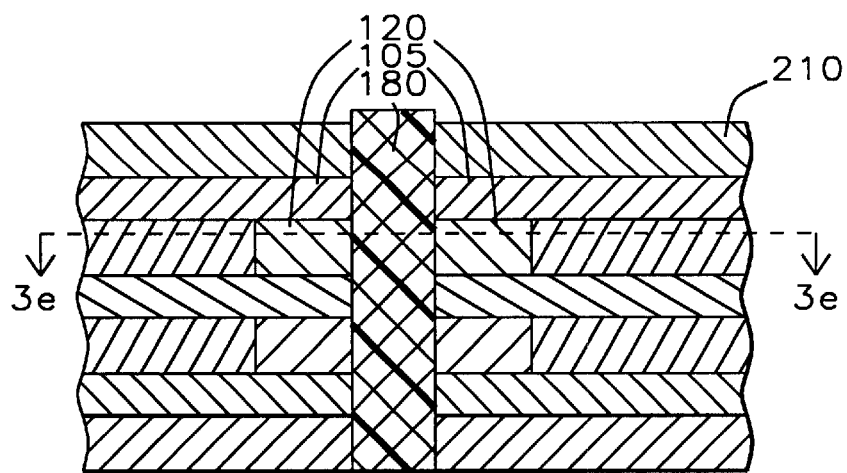
FIGS. 2e and 3e are the top and cross-sectional views, respectively, of a portion of a substrate showing the forming of a third polysilicon layer over the substrate of FIGS. 2d and 3d, according to the present invention.
Figure 2F:
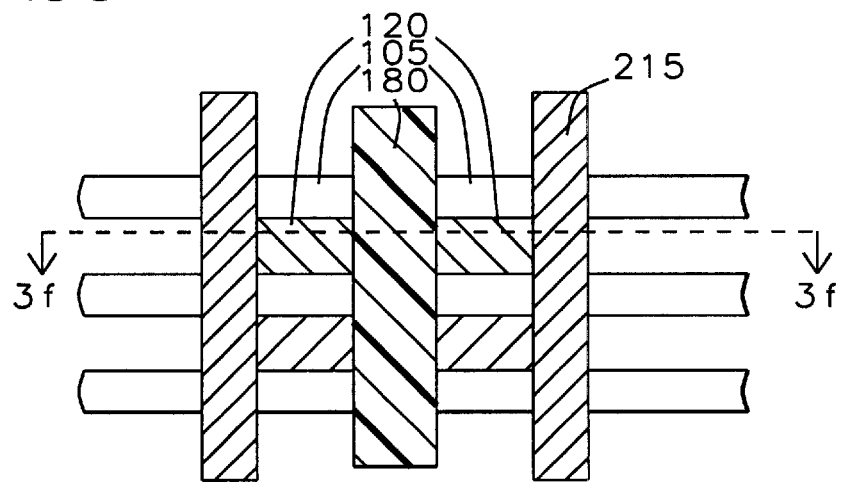
FIGS. 2f and 3f are the top and cross-sectional views, respectively, of a portion of a substrate showing the forming of contoured poly-spacers by performing a poly etch back, according to the present invention.
Figure 2G:
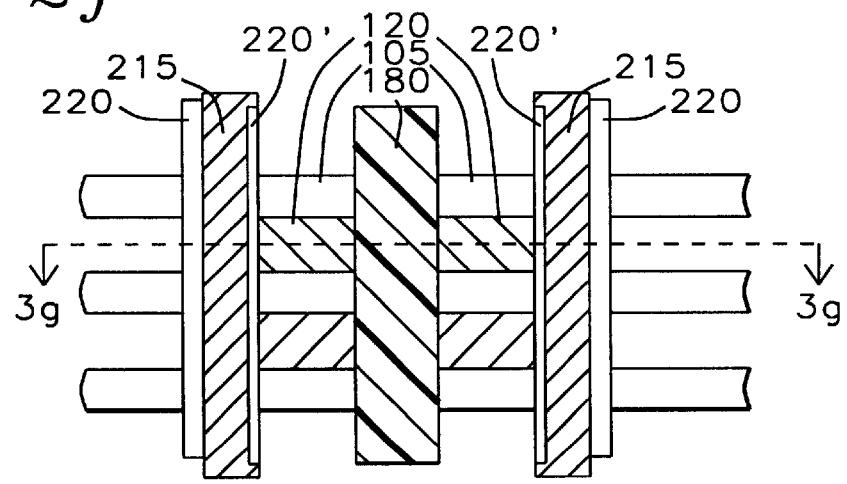
FIGS. 2g and 3g are the top and cross-sectional views, respectively, of a portion of a substrate showing the forming of nitride spacers over the poly spacers of FIGS. 2f and 3f, according to the present invention.
Figure 2H:
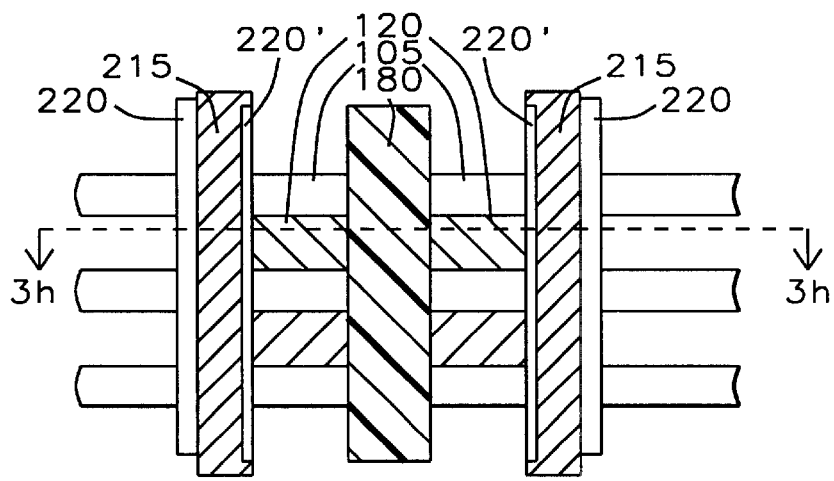
FIGS. 2h and 3h are the top and cross-sectional views, respectively, of a portion of a substrate showing the forming of salicides over the substrate, according to the present invention.
Figure 3E:
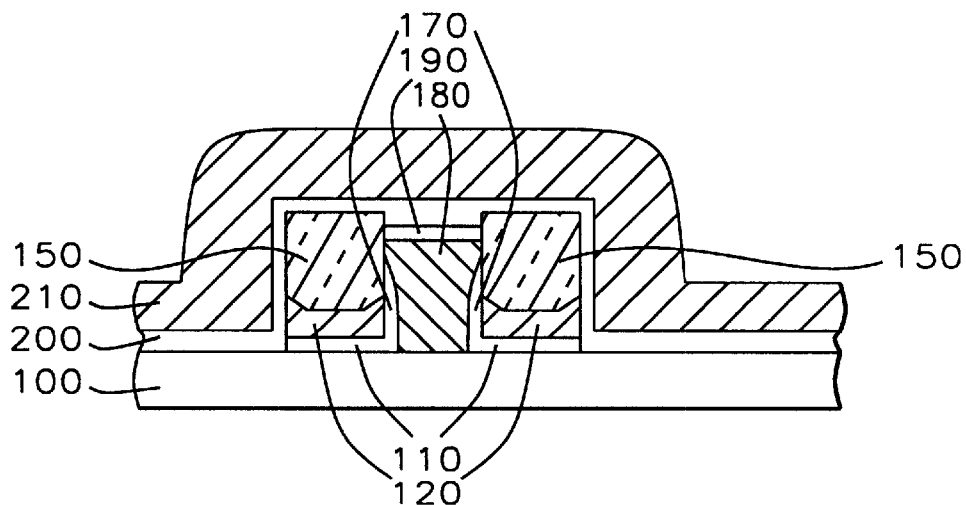

Next, a third polysilicon layer is formed over the substrate as shown both in the top and cross-sectional views, namely, in FIGS. 3e and 2e, respectively. Preferably, third polysilicon layer (210) is deposited to a thickness between about 1500 to 2500 Å. An important step of the present invention, as practiced in the current manufacturing line, is to form a poly spacer to perform as a control gate in order to shrink the size of the conventional flash memory cells. Thus, poly spacer (215) is formed by etching back third polysilicon layer (210). It will be noted in FIG. 3f that the resulting poly spacer (215) has a continuously varying contour. Additional nitride spacers of approximately the same non-vertical shape are also formed by first depositing a third nitride layer and etching back to form spacers (220) and (220') as shown in FIG. 3g. The superposition of nitride spacers over poly spacers can also be seen in the top view shown in FIG. 2g, and also in FIG. 2f where only the top view of poly spacer (215) is seen.

Figure 3F:
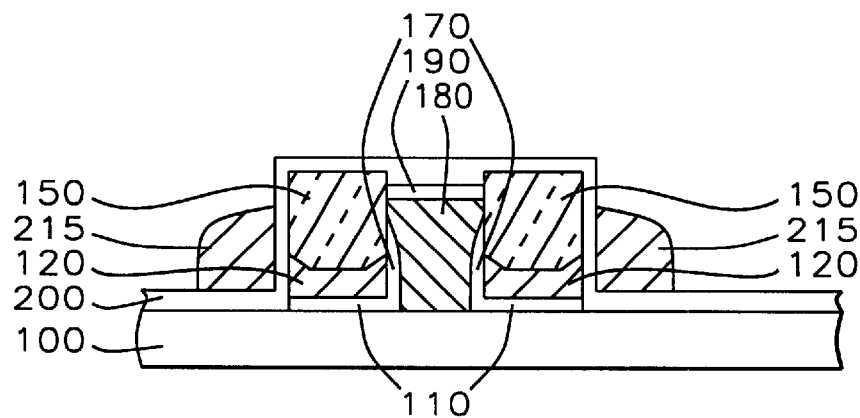
Figure 3G:
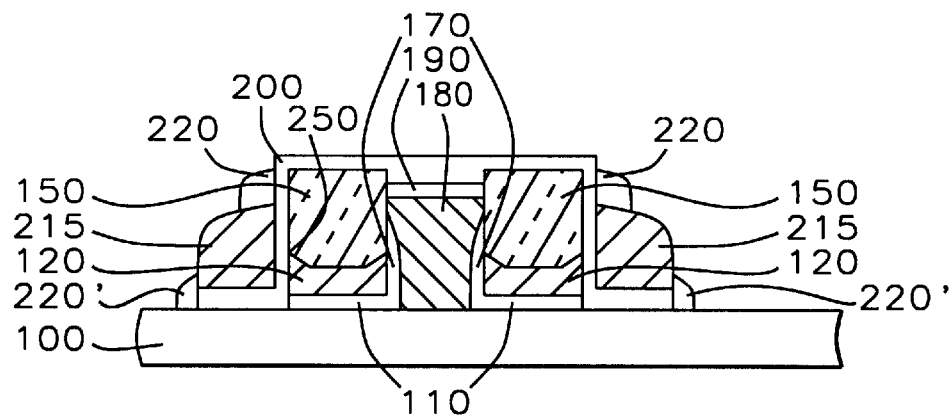
Figure 3H:
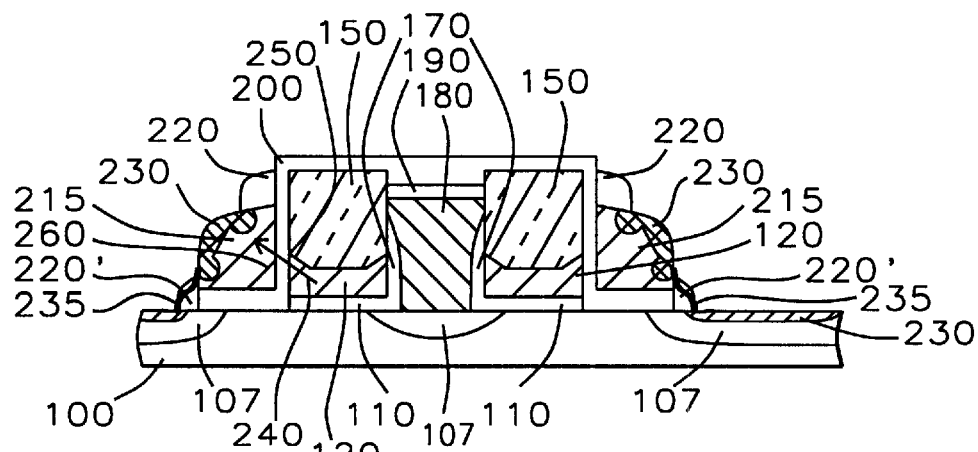

With the nitride spacers so formed, and source/drains (107) also, the split-gate flash memory cell of FIG. 3h is programmed through electron transfer from substrate to floating gate (120) by way of path (240) crossing poly tip (250), while the erase function is accomplished through electron transfer by way of path (250). The effectiveness of the operation of the cell is further enhanced by forming salicides (230) as sown in FIG. 3h, which are then connected to word lines (not shown). As salicides are known in the art, it will not be described here in detail in order not to obscure the main aspects of the present invention. Suffice it to say that salicides can be formed by depositing on the substrate silicide metals and heating the substrate.

However, it will be apparent to those skilled in the art that because especially the lower nitride spacers, namely, spacers (220') are too short, bridging (235) can occur as shown in FIG. 3h, thus causing a short between the gate and source/drain (107). This is not acceptable. Hence, it is the main feature and key aspect of the second embodiment shown in FIGS. 4a–4i and 5a–5i that the poly spacer is made of a square shape so as to increase the step height between the substrate and the salicided word line formed on top of the square shaped poly-spacer to prevent the occurrence of any bridging between the gate and source/drain.

Figure 4A:
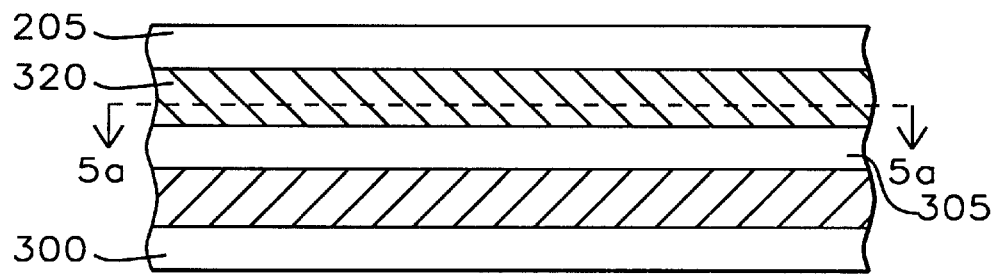
FIGS. 4a–4e, and FIGS. 5a–5e show the same steps as in above for a second embodiment where the subsequent steps differ as follows.
Figure 4B:
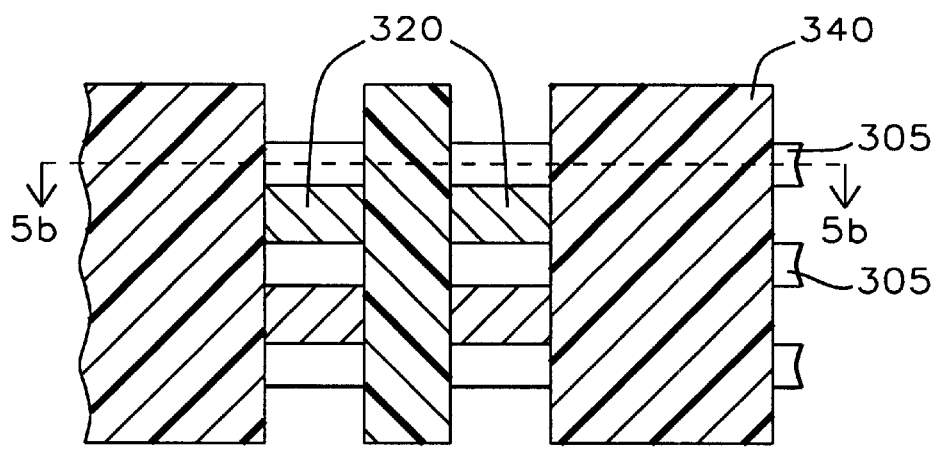
Figure 4C:
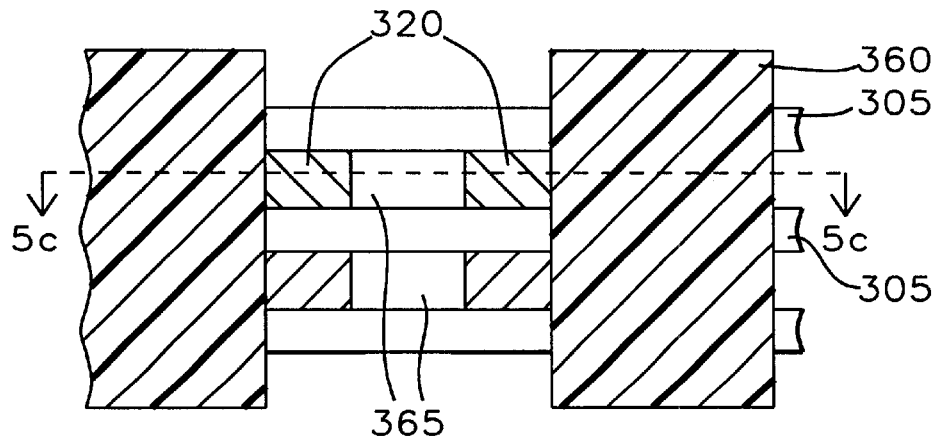
Figure 4D:
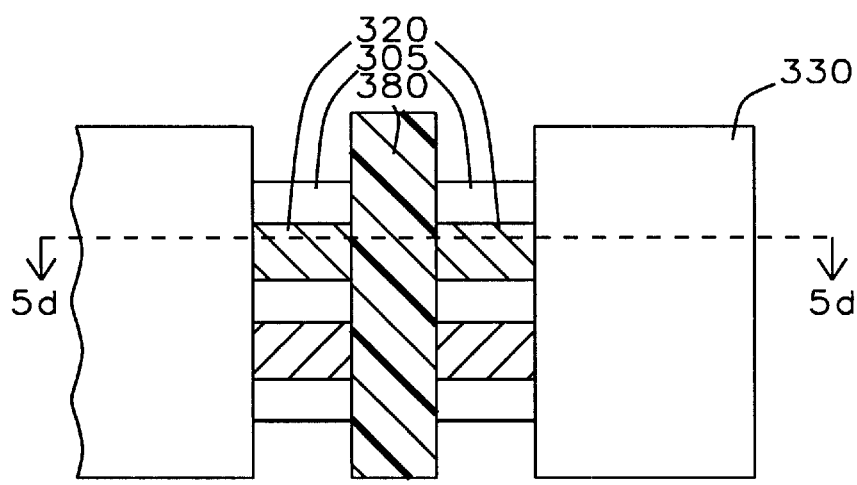
Figure 4E:
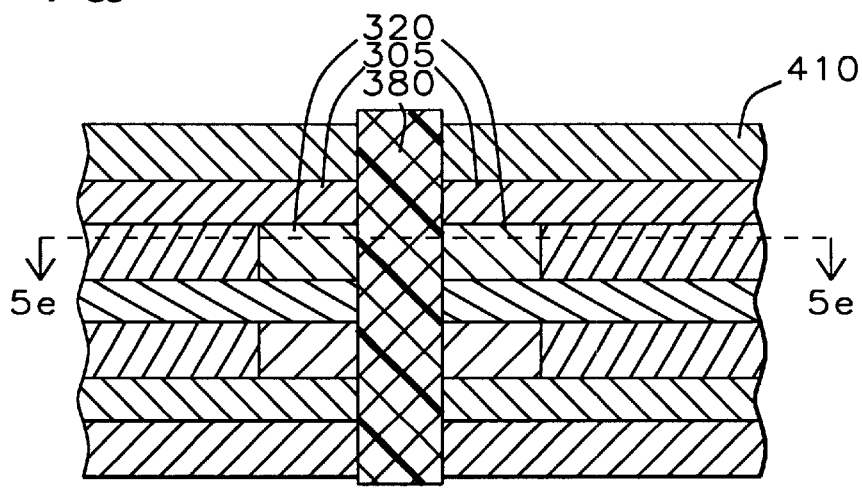
Figure 5A:
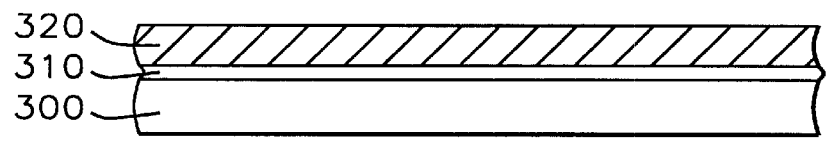
Figure 5B:
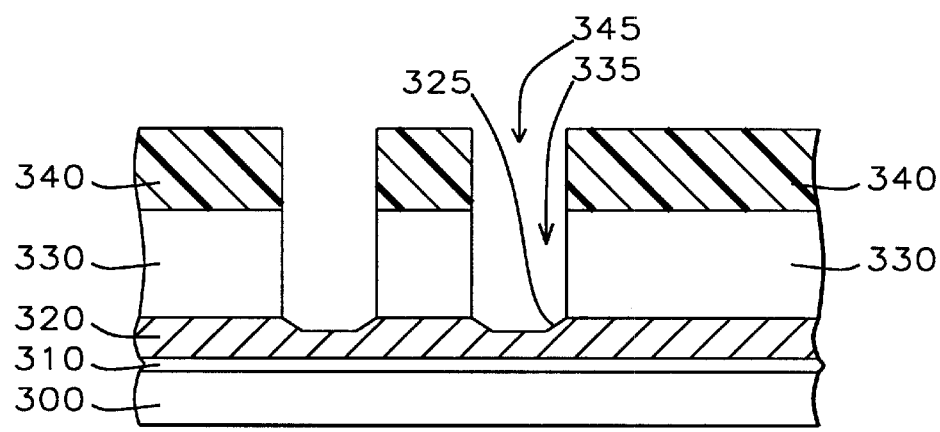
Figure 5C:
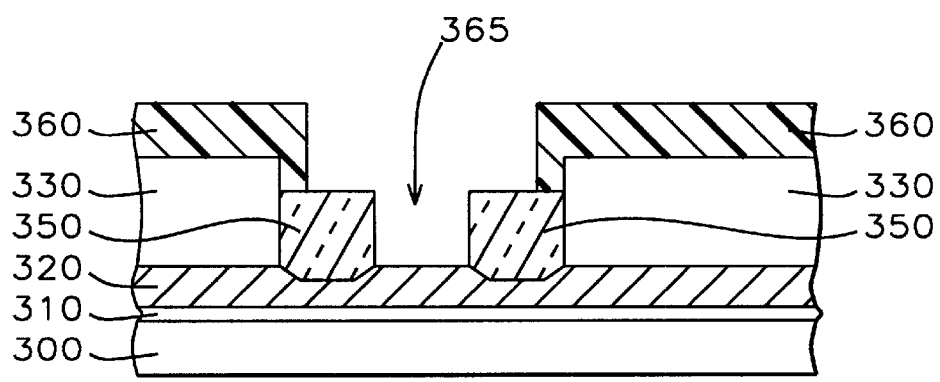
Figure 5D:
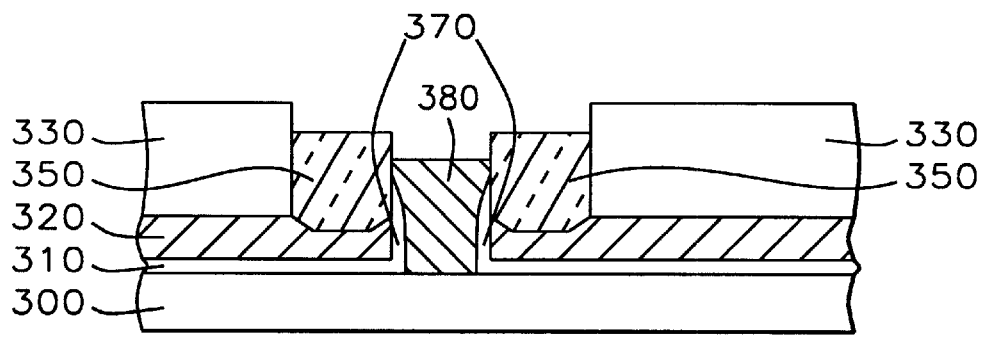
Figure 5E:
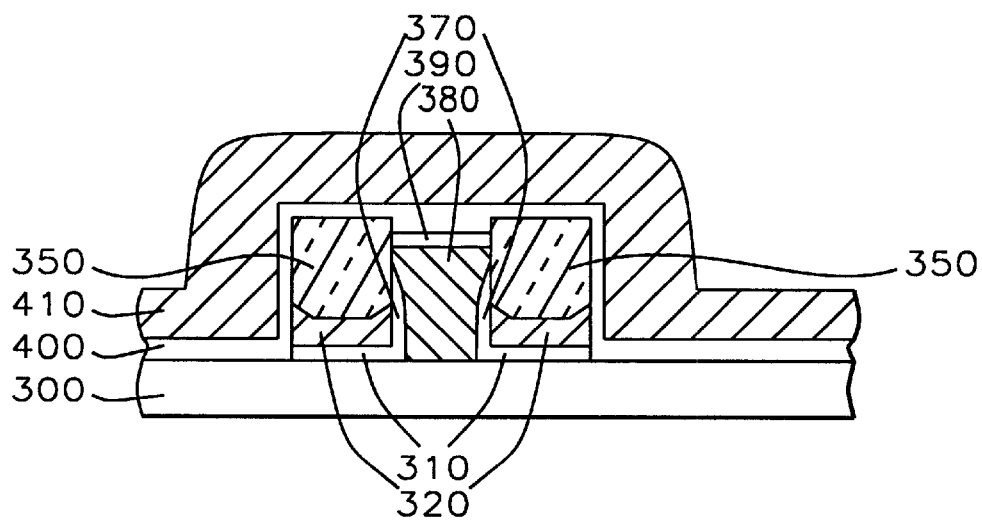
Figure 5F:
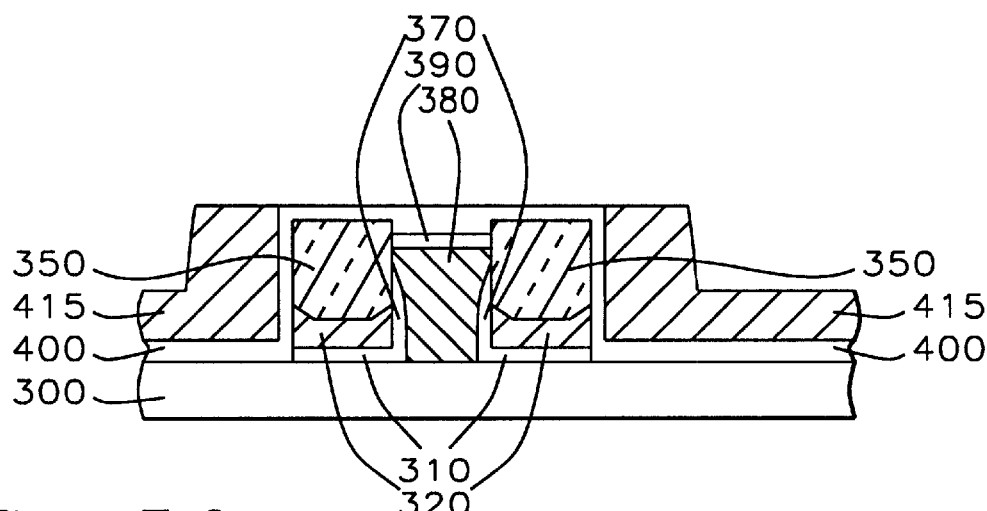

The process steps of the second embodiment are identical to those of the first embodiment up to and including FIGS. 2e/3e and 4e/5e. That is, FIGS. 4a–4e and the corresponding cross-sectional views in FIGS. 5a–5e show the identical steps shown in FIGS. 2a–2e/3a–3e including the reference numerals which have the exact correspondence with the Figures as follows:

providing a substrate (300) having a plurality of active and field regions defined, including shallow trench isolation regions (305); forming first oxide layer (310)over the substrate; forming first polysilicon layer (320) over the first oxide layer; forming first nitride layer (not shown) over the first polysilicon layer; defining first nitride layer to form a shallow trench isolation in the substrate; forming a self-aligned diffusion layer in the substrate; forming second nitride layer (330) over the substrate; patterning the second nitride layer by etching through patterned photoresist layer (340) to define a cell area in the substrate; etching through the patterning in the second nitride layer to form a sloped profile (325) in the first polysilicon layer; forming second oxide layer (350) over the substrate, including over the sloped profile in the first polysilicon layer; planarizing the second oxide layer over the substrate using second polysilicon layer (360); patterning the second oxide layer to form opening (365) including over the cell area; etching through the patterning in the second oxide layer to remove the second nitride layer over the cell area; etching further through the patterning in the second oxide layer to remove the underlying first polysilicon layer to form an opening until the substrate is reached; forming a third oxide layer over the substrate, including over the opening reaching the substrate; etching the third oxide layer to form oxide spacer (370) along the vertical walls of the opening reaching the substrate; forming second polysilicon layer (380) over the substrate, including over the oxide spacer in the opening reaching the substrate; planarizing the second polysilicon layer over the substrate; oxidizing the second polysilicon layer in the opening reaching the substrate to form fourth oxide layer, namely, poly oxide (390); removing the second nitride layer, thus exposing portions of the first polysilicon layer over the substrate; removing the portions of the first polysilicon layer, thus exposing portions of the first oxide layer, namely, gate oxide layer (310); removing the portions of the first oxide layer; forming a fifth oxide layer, namely, intergate oxide layer (400) over the substrate, including over the fourth oxide layer and second oxide layer; forming a third polysilicon layer over the substrate, including over the fourth oxide layer, as seen in the cross-sectional view in FIG. 5e, and in the corresponding top view in FIG. 4e.

Figure 4F:
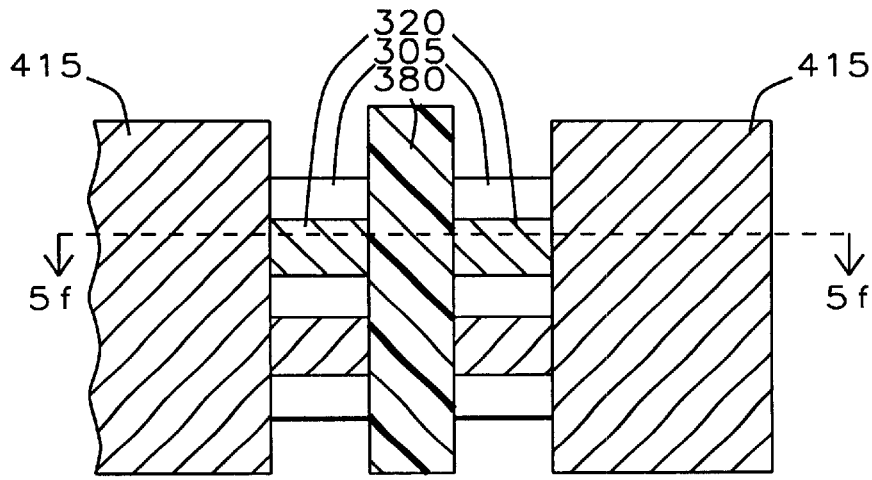
FIGS. 4f and 5f are the top and cross-sectional views, respectively, of a portion of a substrate showing the chemical mechanical polishing of the third polysilicon layer of FIGS. 4e and 4f prior to performing the poly etch back, according to the present invention.
Figure 4G:
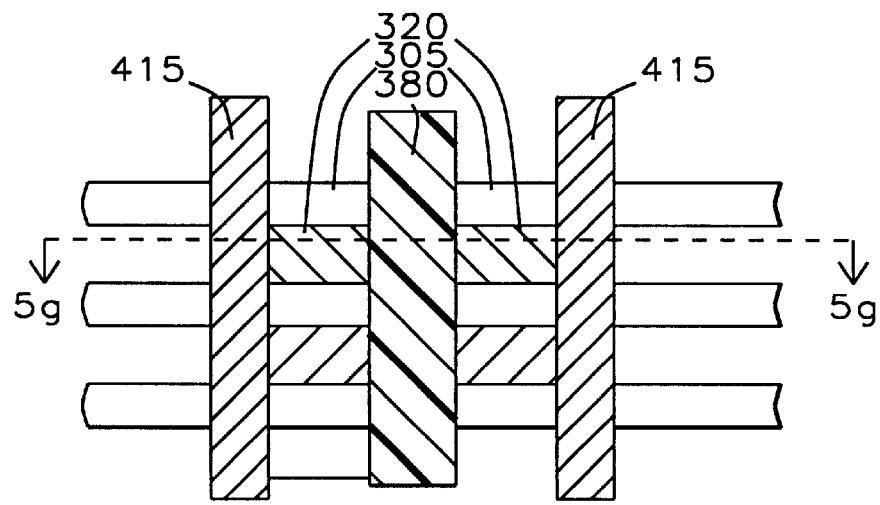
FIGS. 4g and 5g are the top and cross-sectional views, respectively, of a portion of a substrate showing the forming of the preferred square poly-spacers of the present invention by performing etch back after subjecting the substrate to CMP, according to the present invention.
Figure 5G:
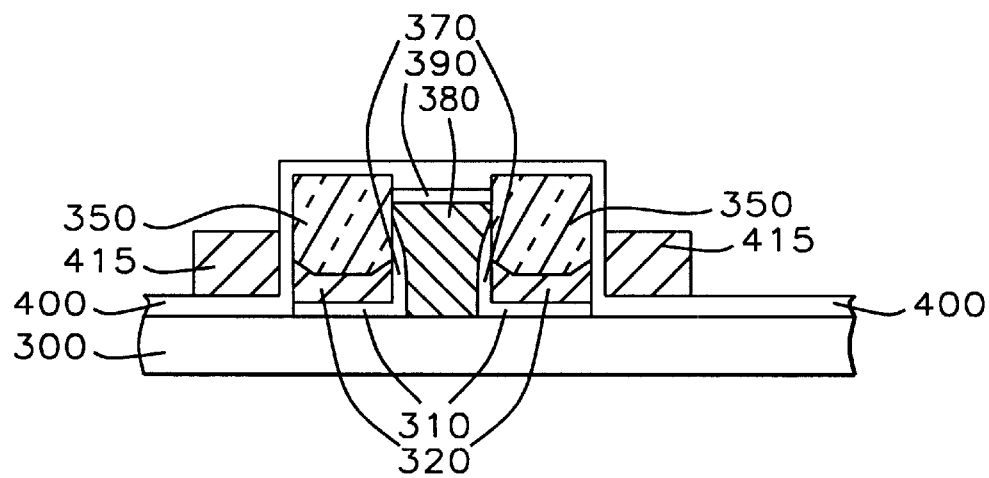

At the next step, in place of simply performing an etch back of the third polysilicon layer as was the case in FIG. 3f of the first embodiment, in the second preferred embodiment, polysilicon layer (410) is first subjected to chemical mechanical polishing (CMP), and only after the CMP is the etch back performed. This main feature of the present invention provides a flat top as shown in the preferred FIG. 5f, so that when the CMP is followed by etch back of the polysilicon, then a square shaped poly-spacer (415) is obtained as shown in FIG. 5g. It will be noted that the corresponding top views are shown in FIGS. 4f and 4g. It is further disclosed here that one or two extra steps of CMP yield even sharper edged square poly-spacers.

Figure 4H:
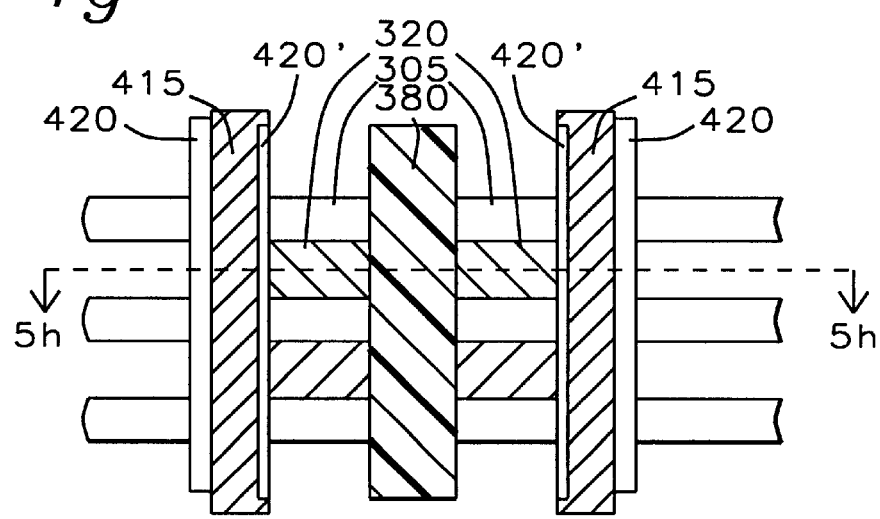
FIGS. 4h and 5h are the top and cross-sectional views, respectively, of a portion of a substrate showing the forming of nitride spacers over the square poly-spacers of FIGS. 4g and 5g, according to the present invention.
Figure 4I:
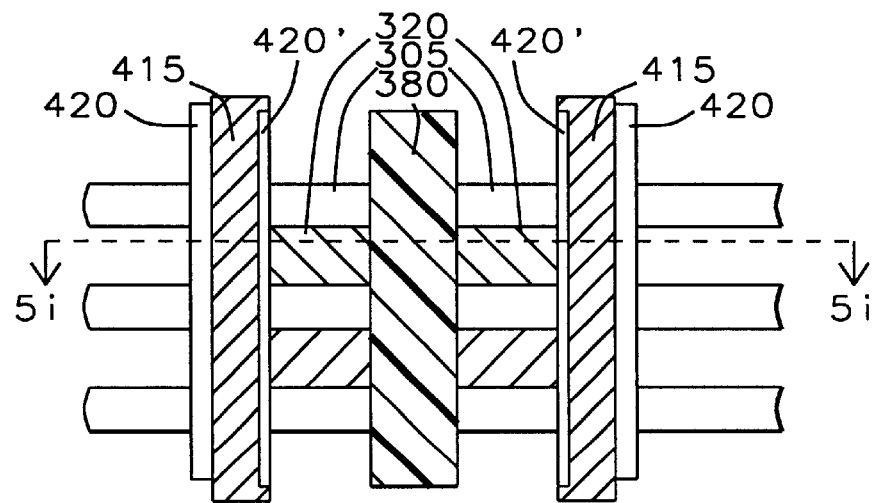
FIGS. 4i and 5i are the top and cross-sectional views, respectively, of a portion of a substrate showing the forming of salicides over the substrate, with no bridging, according to the present invention.
Figure 5H:
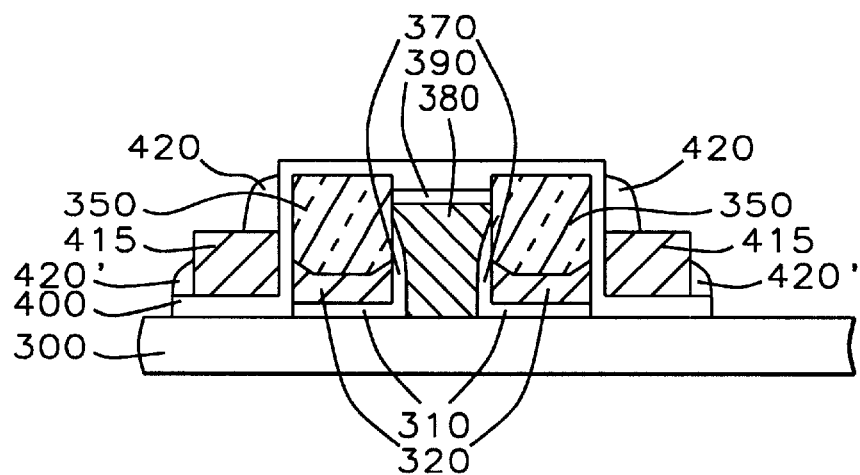
Figure 5I:
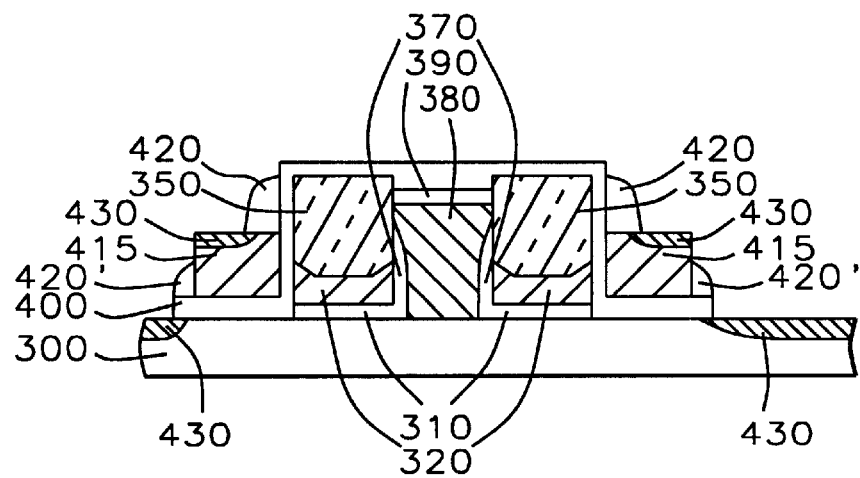

It is evident, therefore, from the remaining FIGS. 5h–5i, and the corresponding FIGS. 4h–4i that when nitride spacers (420) and (420') are formed along the vertical walls of the oxide caps over the floating gates as well as the square poly-spacers (415), the step height of the square poly-spacers are sufficiently high so as to prevent any bridging to occur between the substrate and source/drain when the substrate is salicided as before. This can clearly be seen in FIG. 5i where, due to the verticality of the square poly-spacers, the salicided regions (430) are kept apart without any detrimental effects of bridging.

Though numerous details of the disclosed method are set forth here to provide an understanding of the present invention, it will be obvious, however, to those skilled in the art that these specific details need not be employed to practice the present invention. At the same time, it will be evident that the same methods may be employed in other similar process steps that are too many to cite, such as, for example, in making other devices with straight edged and square poly spacers rather than those that would normally have a contoured profile with a curvature, that is with a variable slope.

That is to say, while the invention has been particularly shown and described with reference to the preferred embodiments thereof, it will be understood by those skilled in the art that various changes in form and details may be made without departing from the spirit and scope of the invention.

What is claimed is:

1. A method of forming a square poly-spacer in a flash memory cell comprising the steps of:
   providing a substrate;
   forming a first dielectric layer over said substrate;
   forming a floating gate with sloped internal walls and vertical external walls over said first dielectric layer;
   forming a second dielectric layer over said floating gate;
   forming a third dielectric layer over said substrate, including over said second dielectric layer over said floating gate and along the vertical walls of both said floating gate and second dielectric layer;
   forming a square poly-spacer along said vertical walls of said floating gate and said second dielectric layer; and forming salicide over said substrate, including over the tops of said square poly-spacer to form a word line without any bridging between said word line and said substrate.

2. The method of claim 1, wherein said substrate is silicon.

3. The method of claim 1, wherein said first dielectric layer is gate oxide formed by thermal growth at a temperature between about 800 to 1000° C.

4. The method of claim 1, wherein said first dielectric layer has a thickness between about 70 to 90 angstroms (Å).

5. The method of claim 1, wherein said floating gate comprises polysilicon formed by employing silane ($SiH_4$) as a silicon source material at a temperature range between about 530 to 620° C.

6. The method of claim 1, wherein said floating gate has a thickness between about 750 to 850 Å.

7. The method of claim 1, wherein said second dielectric layer has a thickness between about 2500 to 3500 Å.

8. The method of claim 1, wherein said third dielectric layer is an intergate oxide formed by thermal oxidation at a temperature between about 800 to 1000° C.

9. The method of claim 1, wherein said third dielectric layer has a thickness between about 160 to 180 Å.

10. A method of forming a square poly-spacer in a flash memory cell comprising the steps of:

providing a substrate;

forming a first oxide layer over said substrate;

forming a floating gate with sloped internal walls and vertical external walls over said first oxide layer;

forming a second oxide layer over said floating gate;

forming a third oxide layer over said substrate, including over said second oxide layer over said floating gate and along the vertical walls of both said floating gate and second oxide layer;

forming a square poly-spacer along said vertical walls of said floating gate and said second oxide layer; wherein said square poly-spacer comprises polysilicon formed by employing silane $SiH_4$ as a silicon source material at a temperature range between about 530 to 620° C.; and forming salicide over said substrate, including over the tops of said square poly-spacer to form a word line without any bridging between said word line and said substrate.

11. A method of forming a square poly-spacer in a flash memory cell comprising the steps of:

providing a substrate having a plurality of active and field regions defined;

forming a first dielectric layer over said substrate;

forming a first polysilicon layer over said first dielectric layer;

forming a first nitride layer over said first polysilicon layer;

defining said first nitride layer to form a shallow trench isolation in said substrate;

forming a self-aligned diffusion region in said substrate;

forming a second nitride layer over said substrate;

patterning said second nitride layer to define a cell area in said substrate;

etching through said patterning in said second nitride layer to form a sloped profile in said first polysilicon layer;

forming a second dielectric layer over said substrate, including over said sloped profile in said first polysilicon layer;

planarizing said second dielectric layer over said substrate;

patterning said second dielectric layer to form an opening including over said cell area;

etching through said patterning in said second dielectric layer to remove said second nitride layer over said cell area;

etching further through said patterning in said second dielectric layer to remove underlying said first polysilicon layer to form an opening until said substrate is reached;

forming a third dielectric layer over said substrate, including over said opening reaching said substrate;

etching said third dielectric layer to form a dielectric spacer along the vertical walls of said opening reaching said substrate;

forming a second polysilicon layer over said substrate, including over said dielectric spacer in said opening reaching said substrate;

planarizing said second polysilicon layer over said substrate;

oxidizing said second polysilicon layer in said opening reaching said substrate to form a fourth dielectric layer;

removing said second nitride layer, thus exposing portions of said first polysilicon layer;

removing said portions of said first polysilicon layer, thus exposing portions of said first dielectric layer;

removing said portions of said first dielectric layer;

forming a fifth dielectric layer over said substrate, including over said fourth dielectric layer and second dielectric layer;

forming a third polysilicon layer over said substrate, including over said fourth dielectric layer;

planarizing said third polysilicon layer until stopped on said fifth dielectric layer over said cell area to form a flat top of said third polysilicon layer;

etching back said third polysilicon layer to form a square polysilicon (poly)-spacer;

forming a third nitride layer over said substrate, including over said square poly-spacer;

etching said third nitride layer to form a nitride spacer along the vertical walls, including that of said square poly-spacer; and forming salicide over said substrate, including over the top of said square poly-spacer to form a word line without any bridging between said word line and said substrate.

12. The method of claim 11, wherein said substrate is silicon.

13. The method of claim 11, wherein said first dielectric layer is gate oxide formed by thermal growth at a temperature between about 800 to 1000° C.

14. The method of claim 11, wherein said first dielectric layer has a thickness between about 70 to 90 Å.

15. The method of claim 11, wherein said forming said first polysilicon layer is accomplished using silane ($SiH_4$) as a silicon source in an LPCVD at a temperature between about 530 to 620° C.

16. The method of claim 11, wherein said first polysilicon layer has a thickness between about 750 to 850 Å.

17. The method of claim 11, wherein said first nitride layer is formed by reacting dichlorosilane ($SiCl_2H_2$), or silane ($SiH_4$), with ammonia ($NH_3$) in an LPCVD at a temperature between about 700 to 800° C.

18. The method of claim 11, wherein said first nitride layer has a thickness between about 1500 to 1700 Å.

19. The method of claim 11, wherein said second nitride layer is formed by reacting dichlorosilane ($SiCl_2H_2$), or silane ($SiH_4$), with ammonia ($NH_3$) in an LPCVD at a temperature between about 700 to 800° C.

20. The method of claim 11, wherein said second nitride layer has a thickness between about 2400 to 2600 Å.

21. The method of claim 11, wherein said second dielectric layer has a thickness between about 2500 to 3500 Å.

22. The method of claim 11, wherein said planarizing said second dielectric layer is accomplished by chemical mechanical polishing (CMP).

23. The method of claim 11, wherein said third dielectric layer has a thickness between about 450 to 550 Å.

24. The method of claim 11, wherein said forming said second polysilicon layer is accomplished by employing silane $SiH_4$ as a silicon source material at a temperature range between about 530 to 620° C.

25. The method of claim 11, wherein said second polysilicon layer has a thickness between about 2500 to 3500 Å.

26. The method of claim 11, wherein said planarizing said second polysilicon layer is accomplished by chemical mechanical polishing.

27. The method of claim 11, wherein said fourth dielectric layer is poly oxide formed by oxidizing said second polysilicon layer in a wet atmosphere at a temperature between about 800 to 1000° C.

28. The method of claim 11, wherein said fourth dielectric layer has a thickness between about 150 to 250 Å.

29. The method of claim 11, wherein said fifth dielectric layer is an intergate oxide formed by thermal growth at a temperature between about 800 to 1000° C.

30. The method of claim 11, wherein said fifth dielectric layer s a thickness between about 165 to 175 Å.

31. The method of claim 11, wherein said third polysilicon layer has a thickness between about 1500 to 2500 Å.

32. The method of claim 11, wherein said planarizing said third polysilicon layer is accomplished by chemical mechanical polishing (CMP).

33. The method of claim 11, wherein said third nitride layer has a thickness between about 1500 to 2500 Å.

34. The method of claim 11, wherein said forming said salicide over said substrate, including over the top of said square poly-spacer to form a word line without any bridging between said word line and said substrate is accomplished by depositing a silicide metal.

35. A square poly-spacer coupled to a wordline of a split-gate flash memory cell comprising:
 a substrate;
 a gate oxide layer over said substrate;
 two floating gates sharing a source line therebetween said floating gates, wherein said floating gates are separated from said source line with an intervening dielectric spacer;
 two dielectric caps formed over said two floating gates;
 a dielectric cap over said source line therebetween said floating gates;
 an intergate oxide layer encompassing said two floating gates and their said two dielectric caps, including said source line with its own dielectric cap therebetween;
 a square poly-spacer vertically adjacent said intergate oxide layer encompassing said two floating gates and source line therebetween;
 a salicide word line formed over the top of said square poly-spacer; and
 a nitride spacer formed on the vertical walls of said square poly-spacer and another nitride spacer adjacent said intergate dielectric layer on the vertical walls of said floating gates.

36. The square poly-spacer of claim 35, wherein said substrate is silicon.

37. The square poly-spacer of claim 35, wherein said gate dielectric layer has a thickness between about 70 to 90 Å.

38. The square poly-spacer of claim 35, wherein said floating gates comprise polysilicon.

39. The square poly-spacer of claim 35, wherein said floating gates have a thickness between about 750 to 850 Å.

40. The square poly-spacer of claim 35, wherein said source line comprises polysilicon.

41. The square poly-spacer of claim 35, wherein said intergate oxide layer has a thickness between about 160 to 180 Å.

42. The method of claim 10, wherein said substrate is silicon.

43. The method of claim 10, wherein said first dielectric layer is gate oxide formed by thermal growth at a temperature between about 800 to 1000° C.

44. The method of claim 10, wherein said first dielectric layer has a thickness between about 70 to 90 Å.

45. The method of claim 10, wherein said floating gate comprises polysilicon formed by employing silane ($SiH_4$) as a silicon source material at a temperature range between about 530 to 620° C.

46. The method of claim 10, wherein said floating gate has a thickness between about 750 to 850 Å.

47. The method of claim 10, wherein said second dielectric layer has a thickness between about 2500 to 3500 Å.

48. The method of claim 10, wherein said third dielectric layer is an intergate oxide formed by thermal oxidation at a temperature between about 800 to 1000° C.

49. The method of claim 10, wherein said third dielectric layer has a thickness between about 160 to 180 Å.

* * * * *